US009424936B1

(12) United States Patent
Tanzawa et al.

(10) Patent No.: US 9,424,936 B1
(45) Date of Patent: Aug. 23, 2016

(54) CURRENT LEAKAGE REDUCTION IN 3D NAND MEMORY

(71) Applicant: Intel Corporation, Santa Clara, CA (US)

(72) Inventors: Toru Tanzawa, Tokyo (JP); Akira Goda, Boise, ID (US); Shigekazu Yamada, Tokyo (JP); Hiroyuki Sanda, Palo Alto, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/666,147

(22) Filed: Mar. 23, 2015

(51) Int. Cl.
*G11C 16/04* (2006.01)
*G11C 16/10* (2006.01)
*G11C 16/26* (2006.01)
*G11C 16/08* (2006.01)

(52) U.S. Cl.
CPC .......... *G11C 16/10* (2013.01); *G11C 16/08* (2013.01); *G11C 16/26* (2013.01); *G11C 16/0483* (2013.01)

(58) Field of Classification Search
CPC .... G11C 16/0483; G11C 16/08; G11C 16/10; G11C 8/08; G11C 16/12; G11C 11/413; G11C 13/0028
USPC .............. 365/185.11, 185.18, 185.17, 185.23
See application file for complete search history.

(56) References Cited

U.S. PATENT DOCUMENTS

| 8,804,430 | B2 * | 8/2014 | Lai ..................... | G11C 11/5628 365/185.17 |
| 9,001,584 | B2 * | 4/2015 | Ha ...................... | G11C 16/04 365/185.11 |
| 9,025,381 | B2 * | 5/2015 | Hendrickson ............ | G11C 8/08 365/185.12 |
| 2006/0215477 | A1 | 9/2006 | Yano et al. | |
| 2007/0133294 | A1 | 6/2007 | Han et al. | |
| 2010/0238729 | A1 | 9/2010 | Lee et al. | |
| 2014/0192594 | A1 | 7/2014 | Lue | |
| 2014/0321215 | A1 | 10/2014 | Sakui | |

OTHER PUBLICATIONS

Komori, Y., et al., "Disturbless Flash Memory due to High Boost Efficiency on BiCS Structure and Optimal Memory Film Stack for Ultra High Density Storage Device," Electron Devices Meeting, 2008. (IEDM 2008) IEEE International, Dec. 15-Dec. 17, 2008, pp. 1-4.

Fukuzumi, Y., et al., "Optimal Integration and Characteristics of Vertical Array Devices for Ultra-High Density, Bit-Cost Scalable Flash Memory," Electron Devices Meeting, 2007, (IEDM 2007) IEEE International, Dec. 10-Dec. 12, 2007, pp. 449-452.

(Continued)

*Primary Examiner* — David Lam
(74) *Attorney, Agent, or Firm* — Schwabe, Williamson & Wyatt, P.C.

(57) ABSTRACT

Embodiments of the present disclosure are directed towards techniques and configurations for providing an apparatus comprising a memory array, to which bias voltage may be provided to reduce leakage current. In one embodiment, the apparatus may comprise a three-dimensional (3D) memory array having at least first and second blocks; and circuitry coupled with the 3D memory array to access the 3D memory array. The circuitry may include circuit to deselect the first block and select the second block, and supply a first bias voltage to the deselected first block and a second bias voltage to the selected second block, to reduce leakage current in the 3D memory array. The first bias voltage may be different than the second bias voltage. Other embodiments may be described and/or claimed.

18 Claims, 8 Drawing Sheets

(56) References Cited

OTHER PUBLICATIONS

Jang, J., et al., "Vertical Cell Array using TCAT(Terabit Cell Array Transistor) Technology for Ultra High Density NAND Flash Memory," VLSI Technology, 2009 Symposium, Jun. 16-Jun. 18, 2009, pp. 192-193.

Katsumata, R., et al.,"Pipe-Shaped Bics Flash Memory With 16 Stacked Layers and Multi-Level-Cell Operation for Ultra High Density Storage Devices," VLSI Technology, 2009 Symposium, Jun. 16-Jun. 18, 2009, pp. 136-137.

Kim, J., et al., "Novel Vertical-Stacked-Array-Transistor (VSAT) for ultra-high-density and cost-effective NAND Flash memory devices and SSD (Solid State Drive)," VLSI Technology, 2009 Symposium, Jun. 16-Jun. 18, 2009, pp. 186-187.

Kim, W., et al., "Multi-Layered Vertical Gate NAND Flash Overcoming Stacking Limit for Terabit Density Storage," VLSI Technology, 2009 Symposium, Jun. 16-Jun. 18, 2009, pp. 188-189.

Choi, J., et al., "3D Approaches for Non-volatile Memory," VLSI Technology (VLSIT), 2011 Symposium, Jun. 14-Jun. 16, 2011, pp. 178-179.

Park, T., K., et al. "Three-Dimensional 128Gb MLC Vertical NAND Flash-Memory with 24-WL Stacked Layers and 50MB/s High-Speed Programming," 2014 IEEE International Solid-State Circuits Conference, Feb. 12, 2014.

Suh, K-D, et al., "A 3.3 V 32 Mb NAND Flash Memory with Incremental Step Pulse Programming Scheme," IEEE Journal of Solid-State Circuits, 30(11):1149-1156, Nov. 1995.

International Search Report and Written Opinion, mailed Jun. 3, 2016, issued in corresponding International Application No. PCT/US2016/018734, 11 pages.

\* cited by examiner

Table 302:

| | T1 | T2 | T3 | T4 | T5 | T6 |
|---|---|---|---|---|---|---|
| BL("0") | 0V | 2V | | 0V | | 0V |
| BL("1") | 0V | 0V | | 2V | | 0V |
| SGD0 (sel.) | 0V | 0V | 2V | 2V (V2) | | 0V |
| SGD1-3 | 0V | 2V | | 0V (V1) | | 0V |
| WL1-3 | 0V | 2V | | 10V | | 0V |
| V_pillar("1") | 0V | 1V | | 8V | | 0V |
| V_pillar("0") | 0V | 1V | | 0V | | 0V |
| WL0 (selected) | 0V | 2V | 10V | 20V | 10V | 0V |
| SGS0 (sel.) | 0V | | | 1V (V3) | | 0V |
| SGS1-3 | 0V | | | 1V (V3) | | 0V |
| SRC | 0V | | | 2V | | 0V |

Table 304:

| | T1 | T2.5 | T6 |
|---|---|---|---|
| BL("0") | 0V | 0V | 0V |
| BL("1") | 0V | 2V | 0V |
| SGD0-3 | 0V | 0.5V (V4) | 0V |
| WL0-3 | | ~0V (floating) | |
| V_pillar | | ~0V (floating) | |
| SGS0-3 | 0V | 0.5V (V5) | 0V |
| SRC | 0V | 2V | 0V |

| | T1 | T2 | T3 |
|---|---|---|---|
| BL | 0V | 2V | 0V |
| SGD0 (sel.) | 0V | 5V | 0V |
| SGD1-3 | 0V | 1V (V6) | 0V |
| WL1-3 | 0V | 5V | 0V |
| WL0 (selected) | 0V | 2V | 0V |
| SGS0 (sel.) | 0V | 5V | 0V |
| SGS1-3 | 0V | 0.5V (V7) | 0V |
| SRC | 0V | 1V | 0V |

404

| | T1 | T2 | T3 |
|---|---|---|---|
| BL | 0V | 2V | 0V |
| SGD0-3 | 0V | 1V (V8) | 0V |
| WL0-3 | | floating | |
| SGS0-3 | 0V | 0.5V (V9) | 0V |
| SRC | 0V | 1V | 0V |

FIG. 4

CURRENT LEAKAGE REDUCTION IN 3D NAND MEMORY

FIELD

Embodiments of the present disclosure generally relate to the field of integrated circuits (IC), and more particularly, to techniques associated with current leakage reduction in a three-dimensional NAND memory.

BACKGROUND

Memory provides data storage for electronic systems. Flash memory is one of various memory types, which has numerous uses in modern computers and devices. A typical flash memory may comprise a memory array that includes a large number of non-volatile memory cells arranged in row and column fashion. The cells may usually be grouped into blocks. Each of the cells within a block may be electrically programmed by charging a floating gate. The charge may be removed from the floating gate by a block erase operation. Data may be stored in a cell as charge in the floating gate. NAND memory array may comprise a basic architecture of flash memory.

In recent years, vertical memory, such as three-dimensional (3D) memory has been developed. A 3D flash memory (e.g., 3D NAND memory array) device may include a plurality of strings of charge storage devices (memory cells) stacked over one another, with each charge storage device corresponding to one of multiple tiers of the device. The charge storage devices of a respective string may share a common channel region, such as one formed in a respective pillar of semiconductor material (e.g., polysilicon) about which the string of charge storage devices may be formed.

In another dimension, each group of the plurality of strings may comprise, for example, a group of strings sharing a plurality of access lines, known as wordlines (WLs). Each of the plurality of access lines may couple (e.g., electrically or otherwise operably connect) the charge storage devices (memory cells) corresponding to a respective tier of the plurality of tiers of each string. The charge storage devices coupled by the same access line (and thus corresponding to the same tier) may be logically grouped into memory pages, when each charge storage device comprises a multi-level cell capable of storing two bits of information.

In a third dimension, each group of the plurality of strings may comprise a group of strings coupled by a corresponding data lines, known as bitlines (BLs). A 3D memory may be divided into memory blocks, comprising a plurality of memory pages, selectable via drain-side select gate (hereinafter select gate drain (SGD)) devices and source-side select gate (select gate source (SGS)) devices that may be provided over each end of the pillars to control memory cells. A 3D NAND memory array may utilize floating body pillars with SGS and SGD at the edge.

A read operation of the 3D NAND memory array may comprise access of data stored at a particular memory location of the memory array. Prior to a write (program) operation to a specific block of the memory array, the specific block may first be erased with the application of high voltages.

A program operation may require the careful application of high voltages to a selected memory location, followed by a program verify operation to ensure that the data has been properly programmed. Furthermore, since high voltages are used, the flash chip may be designed to be relatively tolerant to inadvertent programming of non-selected (e.g., deselected) memory cells. Generally, a memory cell may be programmed by applying a high voltage to its gate while keeping its source and drain terminals grounded.

The high electrical field may cause electrons in the memory cell channel to cross the gate oxide and embed in the floating gate (known as Fowler-Nordheim (F-N) tunneling), thereby increasing the effective threshold voltage of the memory cell. Programming may be typically done by the page or block, meaning that all the memory cells in the block connected to the same wordline may be selected to be programmed with write data (e.g., logic "0") at the same time. The remaining memory cells may be unselected (deselected) during programming. Since the memory cells start in the erased state (logic "1") prior to programming, only the memory cells to be programmed with the logic "0" may be subjected to the high electric fields necessary to promote F-N tunneling.

During program operation, at least one memory block of a memory array may be selected for programming, while other blocks of the memory array may be deselected. In the selected block, due to the physical connections of the memory array, all the memory cells along the same wordline may receive the same high voltage programming level. As a result, erased memory cells may have their threshold voltages unintentionally shifted. A program inhibit scheme may be used for preventing those memory cells where no change from the erased state is required, from being programmed to the logic "0" state. More specifically, the program inhibit scheme may be used to increase a pillar potential so that unintended programming of the memory cells that are not supposed to be programmed does not occur. The pillar potential may increase through boosting a current channel of program-inhibited pillar.

However, pillar potential increase may cause a leakage current in the boosted current channel of a program-inhibited pillar. To prevent it, current common source (SRC) of the memory array may be biased to a finite positive voltage to make the pillar's gate to source voltage negative, to reduce the leakage from the boosted channel of the program-inhibited pillar. On the other hand, biasing SRC may increase the leakage current of pillars of deselected memory blocks, which in turn may increase the operation current of the memory array.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

FIG. 3 illustrates tables having example bias conditions for selected and deselected memory blocks of a memory array during an access operation (e.g., program mode), in accordance with some embodiments.

FIG. 4 illustrates tables having example bias conditions for selected and deselected memory blocks of a memory array during an access operation (e.g., read mode), in accordance with some embodiments.

DETAILED DESCRIPTION

Figure 1:
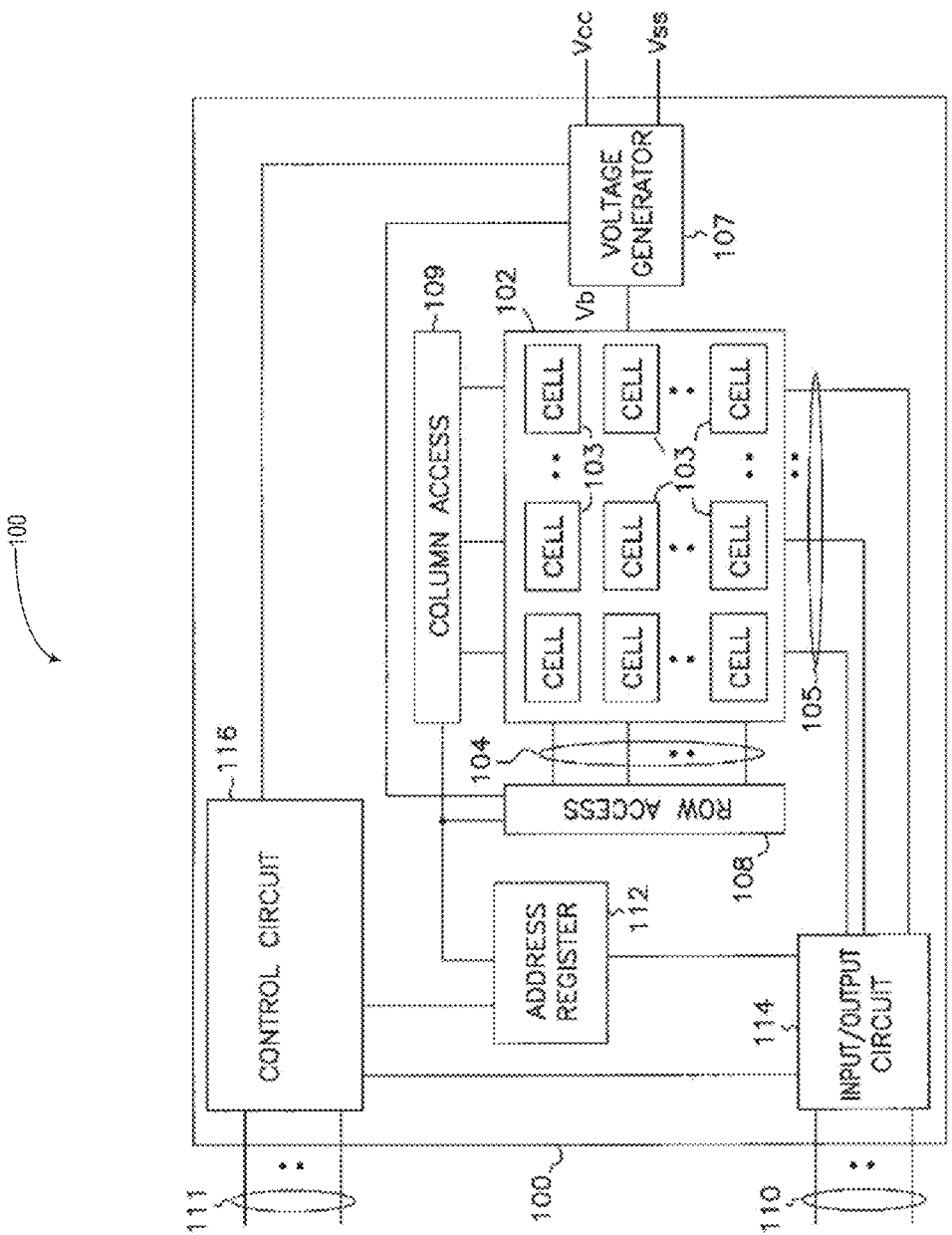
FIG. 1 is an example memory device comprising a 3D memory array, in accordance with some embodiments of the present disclosure.

Embodiments of the present disclosure describe techniques and configurations for an apparatus comprising a memory array, to which bias voltage may be provided to reduce leakage current, in accordance with some embodiments. In some embodiments, an apparatus may comprise a three-dimensional (3D) NAND memory array having at least first and second blocks; and circuitry coupled with the 3D NAND memory array to access the 3D NAND memory array. The circuitry may include circuit to deselect the first block and select the second block, and supply a first bias voltage to the deselected first block and a second bias voltage to the selected second block, to reduce leakage current in the 3D NAND memory array. The first bias voltage may be different than the second bias voltage.

In the following description, various aspects of the illustrative implementations will be described using terms commonly employed by those skilled in the art to convey the substance of their work to others skilled in the art. However, it will be apparent to those skilled in the art that embodiments of the present disclosure may be practiced with only some of the described aspects. For purposes of explanation, specific numbers, materials and configurations are set forth in order to provide a thorough understanding of the illustrative implementations. However, it will be apparent to one skilled in the art that embodiments of the present disclosure may be practiced without the specific details. In other instances, well-known features are omitted or simplified in order not to obscure the illustrative implementations.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), (A) or (B), or (A and B). For the purposes of the present disclosure, the phrase "A, B, and/or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or elements are in direct contact.

FIG. 1 is an example apparatus comprising a 3D memory array incorporated with the current leakage reduction technique of the present disclosure, in accordance with some embodiments. More specifically, the apparatus may comprise a memory device 100 with a 3D memory array 102 having stacked planes of memory cells 103 that may be arranged in rows and columns along with lines (e.g., access lines) 104 and lines (e.g., data lines) 105. Memory device 100 may use lines 104 to access memory cells 103 and lines 105 to exchange information with memory cells 103. Row access 108 and column access circuitry 109 may respond to an address register 112 to access memory cells 103 based on row address and column address signals on lines 110, 111, or both. A data input/output circuit 114 may be configured to exchange data between memory cells 103 and lines 110.

Circuitry including a control circuit 116 may control operations of device 100 based on signals present on lines 110 and 111. A device (e.g., a processor or a memory controller) external to memory device 100 may send different commands (e.g., read, write, or erase command) to memory device 100 using different combinations of signals on lines 110, 111, or both. Control circuit 116 may respond to commands to perform memory operations of accessing a memory cell(s), such as a read operation to read information from memory cells 103 and a write (e.g., programming) operation to store (e.g., program) information into memory cells 103. Control circuit 116 may also perform an erase operation to clear information from some or all of memory cells 103. During various operations, control circuit 116 may cause various memory blocks (groups of memory cells) to be selected or deselected.

Memory device 100 may receive a supply voltage, including supply voltages Vcc and Vss. Supply voltage Vss may operate at a ground potential (e.g., having a value of approximately zero volts). Supply voltage Vcc may include an external voltage supplied to memory device 100 from an external power source such as a battery or an alternating current to direct current (AC-DC) converter circuitry. Further, memory device 100 may include a voltage generator 107. Control circuit 116 (or parts thereof) may be configured to cause voltage generator 107 to generate different voltages for use during memory operations of memory device 100. For example, voltages generated by voltage generator 107 may be applied to lines 104 during a read or write operation to access memory cells 103. Voltage generator 107 and control circuit 116 (or parts thereof) may be referred to separately or together as a module to cause the application of different voltages to components (e.g., lines 104) of memory device 100, including bias voltages according to various embodiments of this disclosure. In embodiments, control circuit 116 and voltage generator 107 may be incorporated with current leakage reduction techniques of the present disclosure to cooperate during memory operations to reduce current leakage of the deselected memory blocks (e.g., by providing bias voltage Vb described below), to be described more fully below with references to FIGS. 2-7.

Memory device 100 may include a non-volatile memory device and memory cells 103 may include non-volatile memory cells, such that memory cells 103 may retain information stored thereon when power (e.g., Vcc, Vss, or both) is disconnected from memory device 100. Each of memory cells 103 may be programmed to store information representing a value of a fraction of a bit, a value of a single bit, or a value of multiple bits such as two, three, four, or another number of bits.

Figure 2:
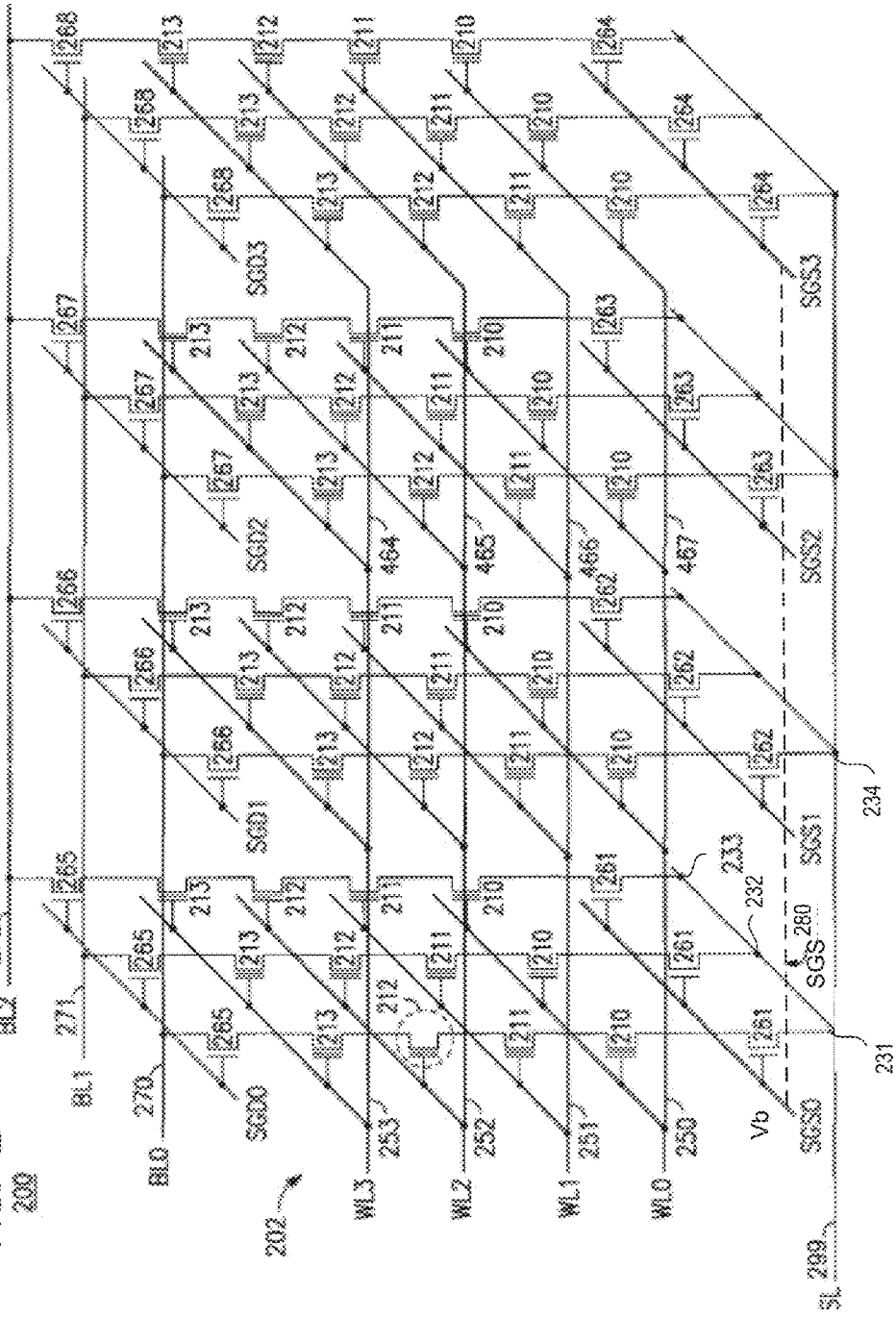
FIG. 2 is an example schematic diagram of a 3D memory array suitable for use with the memory device of FIG. 1, in accordance with some embodiments.

Memory device 100 may be a flash memory device, such as a NAND flash or a NOR flash memory device, or another kind of memory device. Memory device 100 may include a memory array where memory cells 103 may be physically located in multiple levels on the same device, such that some of memory cells 103 may be stacked over some other memory cells 103 in multiple levels over a substrate (e.g., a semiconductor substrate) of memory device 100, forming pillars. One of ordinary skill in the art may recognize that memory device 100 may include other elements, several of which are not shown in FIG. 1, so as not to obscure the example embodiments described herein FIG. 2 is an example schematic diagram of an apparatus comprising a memory device 200 with a 3D memory array 202 suitable for use with memory device 100, in accordance with some embodiments. Memory device 200 may be associated with memory device 100 of FIG. 1, such as forming a portion of 3D memory array 102 of memory device 100. Memory device 200 may include lines (e.g., wordlines) 250, 251, 252, and 253 that may carry corresponding signals WL0, WL1, WL2, and WL3, and may form at least part of access lines of memory device 200. Lines 250, 251, 252, and 253 may correspond to lines 104 of FIG. 1. Memory device 200 may include data lines (bitlines) 270, 271, and 272 that carry signals BL0, BL1, and BL2, respectively. Bitlines 270, 271, and 272 may correspond to lines 105 of FIG. 1.

Four lines (access lines or wordlines) 250, 251, 252, and 253 and three bitlines 270, 271, and 272 are shown in FIG. 2 as an illustrative example only. The number of these lines may vary. Memory device 200 may include memory cells 210, 211, 212, and 213, and transistors 261 through 268. These memory cells 210, 211, 212, and 213 and transistors 261 through 268 may be arranged in memory cell strings, such as memory cell strings (pillars) 231, 232, and 233. For simplicity, in FIG. 2, only three of the memory cell strings (pillars) are labeled (231, 232, and 233). The memory array 202 shown in FIG. 2 includes nine memory cell strings and four memory cells 210, 211, 212, and 213 in each memory cell string (pillar).

In summary, the example memory array 202 shown in FIG. 2 is provided for illustrative purposes and is not limiting to this disclosure. One skilled in the art will appreciate that the number of access lines, number of memory cell strings (pillars), and number of memory cells in each memory cell string may vary.

Memory cells 210, 211, 212, and 213 may be physically located in multiple levels of memory device 200, such that memory cells 210, 211, 212, and 213 in the same memory cell string may be stacked over each other in multiple levels of memory device 200, forming a pillar. As shown in FIG. 2, transistors 261 through 268 and may be controlled (e.g., turned on or turned off) by corresponding signals SGD0, SGD1, SGD2, and SGD3, and SGS0, SGS1, SGS2, and SGS3 provided via corresponding lines as shown to couple the memory cell strings to their respective bitlines 270, 271, and 272, and a line 299, during a memory operation, such as a write operation. In some embodiments, depending on a desired memory array 202 configuration, the lines carrying signals SGS0, SGS1, SGS2, and SGS3 may be connected via a common SGS line 280, as shown.

Line 299 may include a common source line of memory device 200 and may carry a signal, such as signal SL. In a memory operation, such as a write operation, different voltages may be applied to lines 250, 251, 252, and 253 to selectively access memory cells 210, 211, 212, and 213 in order to store information into one or more selected memory cell among memory cells 210, 211, 212, and 213. For example, in a write operation, memory device 200 may select memory cell 212 (shown within a dashed circle) of memory cell string 231 to store information into memory cell 212. In this example, memory device 200 may apply a voltage to line 252 and other voltages to lines 250, 251, and 253. The voltage on lines 250, 251, and 253 may have the same or different values. Memory device 200 may include memory devices and operate using memory operations (e.g., write operations) similar to or identical to memory devices and operations described below with reference to FIG. 3 through FIG. 7. For example, the different voltages applied to lines 250, 251, 252, and 253 during a write operation may be similar to or identical to voltages used during a write operation of memory devices described below with reference to FIG. 3 through FIG. 7.

In embodiments, the memory array 202 may comprise one or more memory blocks disposed in a die, such as a NAND die, for example. A memory block may have different memory capacities, depending on technological demand. For simplicity purposes, the memory array 202 illustrated in FIG. 2 illustrates a memory block that includes four sub-blocks defined respectively by SGD0, SGD1, SGD2, and SGD3. In operation, such as when a memory array is to be accessed for programming (or data reading), a memory block may be selected (e.g., for programming) or deselected, in order to refrain from programming while other block(s) are being programmed. Accordingly, in a memory array having a plurality of memory blocks, at least one block may be selected for access (e.g., for a program mode or read mode), while other blocks may be deselected in order to refrain from access. Selection and deselection of memory blocks may be accomplished by application of particular voltage values to respective wordlines and SGS lines.

FIG. 3 illustrates tables having example bias conditions for selected and deselected memory blocks of a memory array during an access operation (e.g., program mode), in accordance with some embodiments. Voltage values V1, V2, V3, V4, and V5 provided in tables 302 and 304 of FIG. 3 are shown for illustrative purposes only and illustrate just one example of biasing selected and deselected blocks of a memory array in order to reduce leakage current.

Table 302 shows a bias condition for a selected block during programming. The program operation is divided into six sequences as T1-6. BL("0" or "1") represents a BL whose program data is "0" or "1". BL is grounded for "0" data and biased at a certain voltage such as 2V for "1". When a selected WL is WL0, the other WLs such as WL1-3 are deselected. WL0 is biased to 2V in T2, 10V in T3, 20V in T4, 19V in T5, and 0V in T6. WL1-3 are biased to 2V in T2, 10V in T2-5, and 0V in T6. When SGD0 is selected, the other SGD such as SGD1-3 are deselected. Thus, there may be four cases in combination of BL voltage and SGD voltage: (1) BL("0") and SGD0 (voltage V2), (2) BL("0") and SGD1-3 (voltage V1), (3) BL("1") and SGD0 (V2), and (4) BL("1") and SGD1-3 (V1). The details of each combination are described as follows.

The potential of pillars which are coupled with BL("0") and SGD0 keeps 0V in T3-5. The selected cell is programmed with WL0 of 20V and V pillar of 0V via F-N tunneling phenomena.

The potential of pillars which are coupled with BL("0") and SGD1-3 increases to 1V in T2 when the threshold voltage of SGD transistor is 1V, and 8V in T3-5 with channel boosting where the SGD transistor is cut off with SGD1-3 of 0V.

The potential of pillars which are coupled with BL("1") and SGD0 increases to 1V in T2 when the threshold voltage of SGD transistor is 1V, and 8V in T3-5 with channel boosting where the SGD transistor is cut off with V_BL of 2V and SGD0 of 2V.

The potential of pillars which are coupled with BL("1") and SGD1-3 increases to 1V in T2 when the threshold voltage of SGD transistor is 1V, and 8V in T3-5 with channel boosting where the SGD transistor is cut off with SGD1-3 of 0V.

Table 302 shows a bias condition for deselected blocks during programming. WL0-3 are left floating in entire periods of T1-T6. SGD0-3 and SGS0-3 may be biased to certain voltages such as V4 and V5, respectively, wherein 0.5V are specified for both as an example. In embodiments, V4 may be different from V5.

FIG. 4 illustrates tables having example bias conditions for selected and deselected memory blocks of a memory array during an access operation (e.g., read mode), in accordance with some embodiments. Table 402 illustrates bias conditions in a selected block, and table 404 illustrates bias conditions in a deselected block. In the illustrated example, cell data is "1" when cell Vt is <1V and is "0" when cell Vt is >1V. By applying 2V to a selected WL0 and 1V to SRC, it may be determined whether the current flows through the selected pillar. If a finite current via BL is detected, the data may be recognized as "1", otherwise the data may be recognized as "0". In order to minimize the leakage current via deselected sub-blocks, voltages V6 and V7 may be applied to SGD and SGS of the selected sub-blocks with, for example, 1V and 0.5V, respectively. Also, voltages V8 and V9 may be applied to SGD and SGS of deselected blocks. In embodiments, V6 may be different from V7, and V8 may be different from V9.

Figure 5:
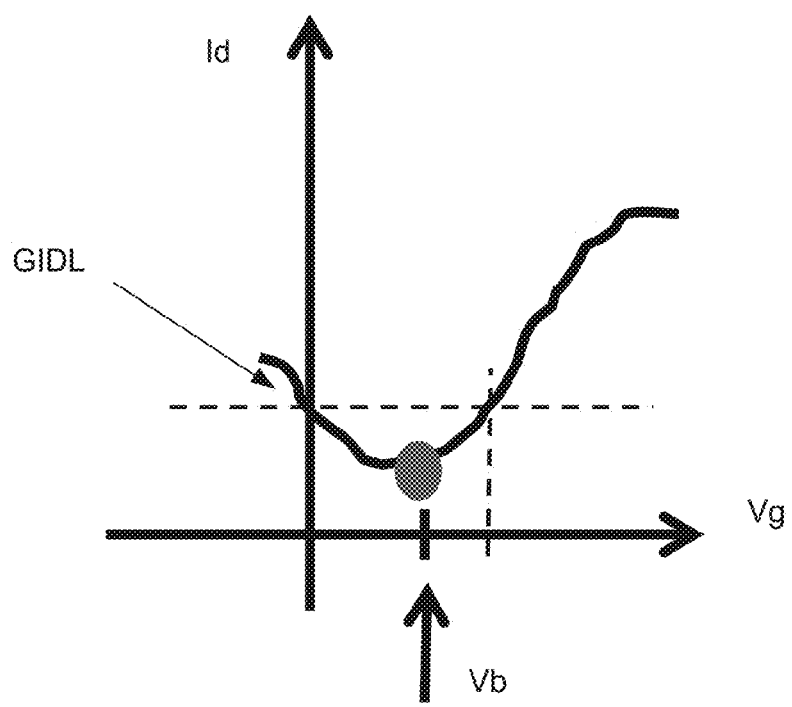
FIG. 5 is an example diagram illustrating drain current Id as a function of gate voltage of a select gate source in a pillar of a memory array, in accordance with some embodiments.

FIG. 5 is an example diagram illustrating drain current Id as a function of gate voltage Vg of an SGS in a pillar of a memory array, in accordance with some embodiments. As shown, at zero value of Vg there may be a finite non-zero Id, representing GIDL current. The value of GIDL may depend on various factors, such as memory manufacturing conditions, ambient temperature, and the like. Vb represents a voltage value at which GIDL current may be at a minimum. The value of Vb may be determined at a fabrication or research and development stage associated with the memory array. SGD has a similar Vg-Id curve as FIG. 3, but may have a different Vg to have a minimum Id.

Referencing table 304 of FIG. 3, in embodiments, SGS0-3 and SGD0-3 of deselected blocks may be biased to a voltage value Vb, in order to minimize GIDL current. For example, SGD0, . . . , SGD1 may be biased to a voltage value V4 and SGS0-3 may be biased to a voltage value V5, providing a pillar bias substantially equivalent to Vb. In embodiments, V4 may be equal V5. In other embodiments, V4 and V5 may be different. Assuming the pillar potential of deselected blocks is as low as 0V because of no precharge, the common source line SL may effectively play a role of the drain of SGS. Accordingly, if, for example, SGS=0V and SRC=2V, there may be a gate induced drain leakage (GIDL) current. GIDL current may increase as SL voltage increases. Similarly, when a SGD of deselected blocks is connected with BL("1"), the BL may effectively play a role of the drain of SGD. Accordingly, if, for example, SGD=0V and BL("1")=2V, there may be a gate induced drain leakage (GIDL) current. GIDL current may increase as BL voltage increases. Furthermore, if there are multiple deselected blocks in a memory array, even a relatively small value of GIDL in each pillar of a deselected block (e.g., 1 pA) may contribute to substantial increase of a memory array operating current ICC. For example, for 1023 deselected blocks of the memory array, the total ICC may reach about 10 mA. Power consumed by the memory array may increase correspondingly to ICC increase, which may be undesirable. SGD of deselected blocks can be the same situation.

The biasing requirements for selected and deselected blocks in a memory array may be different. SGS of a selected block may have sufficiently low leakage current from pillar to SRC. On the other hand, SGS of deselected block may have sufficiently low leakage current from SRC to pillar. In other words, the direction leakage currents in a selected block may be opposite to that of a deselected block. In addition, doping profiles of SGS at SRC and WL0 edges may be different as well as doping profiles of SGD at BL and WL3 edges. Accordingly, different bias voltages on SGS of selected and deselected blocks may minimize each leakage current in each block. Similarly, different bias voltages on SGD of selected and deselected blocks may be different to minimize leakage current.

In summary, as shown in FIGS. 3 and 4, the bias voltage value of SGD of the selected sub-block of the selected block of the memory array may be different than the bias voltage value of SGD lines of the deselected block. Further, the bias voltage value of SGS of the deselected block may be different than the bias voltage value of SGS of the selected block.

Figure 6:
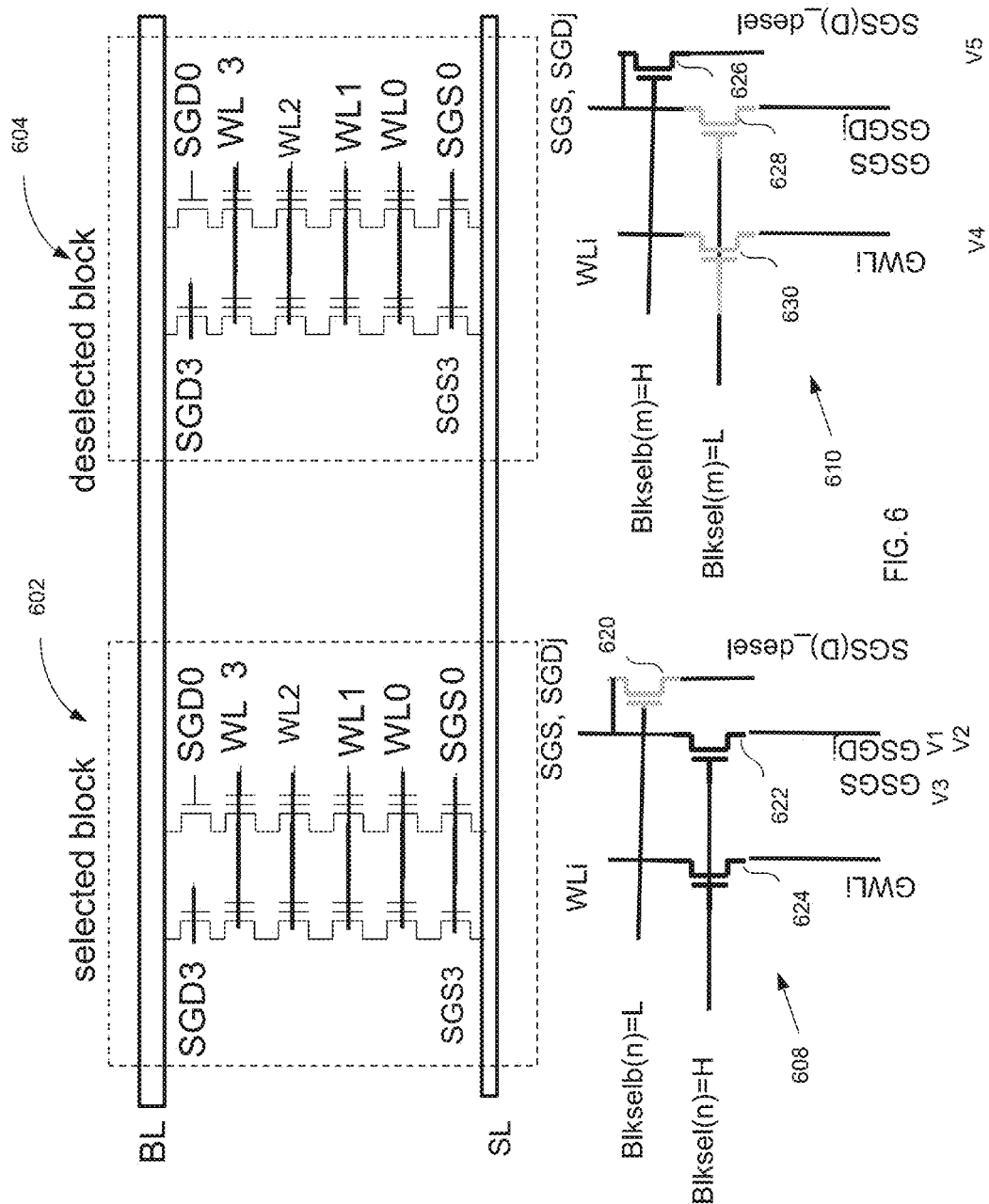
FIG. 6 is an example block diagram of application of bias voltages to selected and deselected blocks of a memory array, in accordance with some embodiments.

FIG. 6 is an example block diagram of application of bias voltages to selected and deselected blocks of a memory array, in accordance with some embodiments. The block diagram illustrates a selected block (e.g., block n) 602 and a deselected block (e.g., block m) 604 of a memory array (not shown), such as the memory array 202. Bias voltages V1-V5 may be provided to blocks 602, 604, for example, by circuitry discussed in reference to FIG. 1, such as power management unit comprising voltage generator 107 and control circuit 116. More specifically, bias voltages V1-V5 may be provided via circuits known to one skilled in the art. For simplicity purposes, only fragments 608 and 610 of the circuitry are illustrated in FIG. 6.

For example, to select a block, a string driver may provide a signal Blksel at a logic high level H, which may be applied to SGS line, and signal Blkselb at a logic low level L, which may be applied to wordlines. To deselect a block, levels of signals Blksel and Blselb may be reversed, e.g., Blksel may equal L and Blkselb may equal H. Accordingly, the blocks 602 and 604 may be selected and deselected by applying corresponding levels of signals Blkselb(n)=L and Blsel(n)=H, and Blkselb(m)=H and Blksel(m)=L respectively, via pass transistors 620, and 622 and 624; and 626, and 628 and 630. Further, V1, V2 and V3 may be applied via global lines GSGD and GSGS of the selected block 602 respectively. V4 and V5 may be applied via lines SGD_desel and SGS_desel respectively, as shown in FIG. 6.

Voltages of V1-V9 may to be lower than the voltages which may not strongly turn SGS or SGD on to have sufficiently low leakage current. Because the minimal Vg for the leakage current is nominally lower than Vt_SGD and higher than 0V, it is recommended that V1, V4, V6, and V8 may be set at a voltage lower than Vt_SGD. Similarly, because the minimal Vg for the leakage current is nominally lower than Vt_SGS and higher than 0V, it is recommended that V3, V5, V7, and V9 may be set at a voltage lower than Vt_SGS. As a result, the voltage values may be specified by either of condition 1 through 6 as follows.

Condition (1): $0V \leq V1 \leq V\_BL(``1")$ and $0V \leq V4 \leq V\_BL(``1")$ and $0V \leq V6 \leq V\_BL(``1")$ and $0V \leq V8 \leq V\_BL(``1")$ and $0V \leq V3 \leq V\_SRC$ and $0V \leq V5 \leq V\_SRC$ and $0V \leq V7 \leq V\_SRC$ and $0V \leq V9 \leq V\_SRC$, where V_SRC and V_BL("1") are respectively the voltage at SRC and BL for "1"-program during program.

Condition (2): Condition 1 and at least one of V1-9 is not equal to 0V.

Condition (3): $0V \leq V1 \leq Vt\_SGD$ and $0V \leq V4 \leq Vt\_SGD$ and $0V \leq V6 \leq Vt\_SGD$ and $0V \leq V8 \leq Vt\_SGD$ and $0V \leq V3 \leq Vt\_SGS$ and $0V \leq V5 \leq Vt\_SGS$ and $0V \leq V7 \leq Vt\_SGS$ and $0V \leq V9 \leq Vt\_SGS$, where Vt_SGS, Vt_SGD is the threshold voltage of SGS and SGD, respectively.

Condition (4): Condition 3 and at least one of V1-9 is not equal to 0V.

Condition (5): condition 1 or 2 or 3 or 4 wherein at least one of V1-9 depends on temperature.

Figure 7:
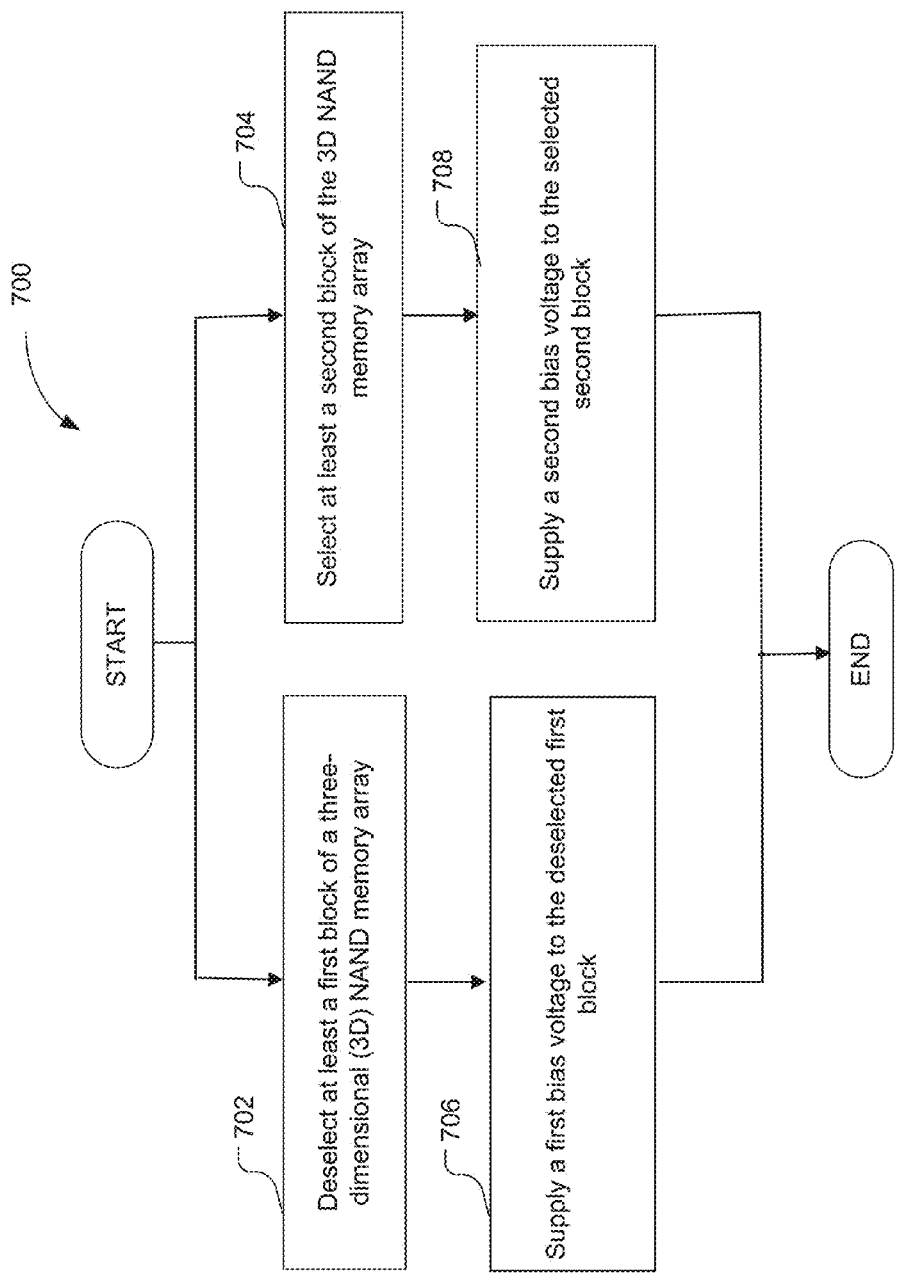
FIG. 7 is a flow diagram for a method of biasing a 3D memory array to reduce leakage current, in accordance with some embodiments.

Condition (6): condition 5, wherein the temperature coefficient is negative. Condition 6 may be effective when the minimal Vg for the leakage current has significant temperature dependency FIG. 7 is a flow diagram for a method of biasing a 3D memory array to reduce leakage current, in accordance with some embodiments. The method 700 may comport with actions described in connection with FIGS. 3-6 in some embodiments.

At block 702, the method 700 may include deselecting at least a first block of a three-dimensional (3D) NAND memory array.

At block 704, the method 700 may further include selecting at least a second block of the 3D NAND memory array. Selecting the second block may further include selecting at least one sub-block and deselecting remaining sub-blocks in the selected second block.

At block 706, the method 700 may further include supplying (or causing to be supplied) a first bias voltage to the deselected first block. This may further include supplying a first voltage value to a plurality of SGD lines of the deselected first block and supplying a third voltage value to an SGS line of the deselected first block.

At block 708, the method 700 may further include supplying (or causing to be supplied) a second bias voltage to the selected second block, to reduce leakage current in the 3D NAND memory array. This may further include supplying a second voltage value to an SGD line of the selected sub-block of the selected second block, and supplying a fourth voltage value to an SGS line of the selected second block.

Various operations of the method 700 are described as multiple discrete operations, in a manner that is most helpful in understanding the claimed subject matter. However, the order of description should not be construed as to imply that these operations are necessarily order dependent. It will be appreciated that sequence of operations associated with method 700 may vary and/or include other actions in accordance with the present disclosure.

The memory arrays and methods described herein may be implemented into a system using any suitable hardware and/or software to configure as desired.

Figure 8:
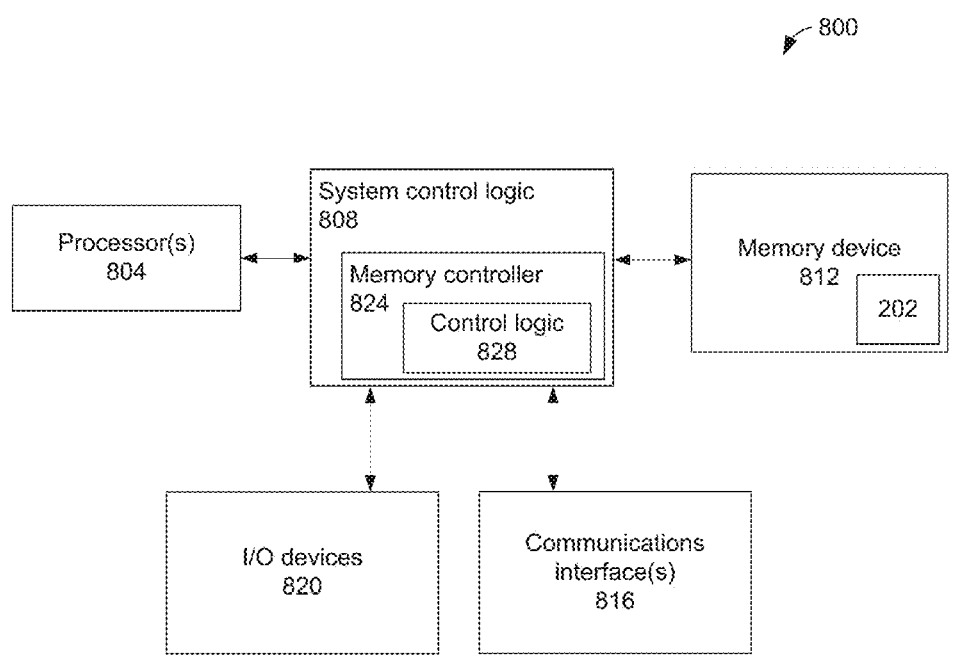
FIG. 8 schematically illustrates an example computing device 800 including a memory array having the current leakage reduction technique of the present disclosure, in accordance with some embodiments.

FIG. 8 schematically illustrates an example computing device 800 including a memory array having current leakage reduction techniques of the present disclosure, in accordance with some embodiments. The computing device 800 may include system control logic 808 coupled to one or more processor(s) 804; a memory device 812 having a memory array; one or more communications interface(s) 816; and input/output (I/O) devices 820.

The memory device 812 may be a non-volatile computer storage chip that may include the memory device 100 with memory blocks biased during operation, as described in reference to FIGS. 3-7. In addition to the memory array, the memory device 812 may include a package, having the memory device 100 disposed therein, driver circuitry (e.g., drivers), input/output connections to electrically couple the memory device 812 with other components of the computing device 800, etc. The memory device 812 may be configured to be removably or permanently coupled with the computing device 800.

Communications interface(s) 816 may provide an interface for computing device 800 to communicate over one or more network(s) and/or with any other suitable device. Communications interface(s) 816 may include any suitable hardware and/or firmware. Communications interface(s) 816 for one embodiment may include, for example, a network adapter, a wireless network adapter, a telephone modem, and/or a wireless modem. For wireless communications, communications interface(s) 816 for one embodiment may use one or more antennas to communicatively couple the computing device 800 with a wireless network.

For one embodiment, at least one of the processor(s) 804 may be packaged together with logic for one or more controller(s) of system control logic 808. For one embodiment, at least one of the processor(s) 804 may be packaged together with logic for one or more controllers of system control logic 808 to form a System in Package (SiP). For one embodiment, at least one of the processor(s) 804 may be integrated on the same die with logic for one or more controller(s) of system control logic 808. For one embodiment, at least one of the processor(s) 804 may be integrated on the same die with logic for one or more controller(s) of system control logic 808 to form a System on Chip (SoC).

System control logic 808 for one embodiment may include any suitable interface controllers to provide for any suitable interface to at least one of the processor(s) 804 and/or to any suitable device or component in communication with system control logic 808. The system control logic 808 may move data into and/or out of the various components of the computing device 800.

System control logic 808 for one embodiment may include a memory controller 824 to provide an interface to the memory device 812 to control various memory access operations. The memory controller 824 may include control logic 828 that may be specifically configured to control access of the memory device 812.

In various embodiments, the I/O devices 820 may include user interfaces designed to enable user interaction with the computing device 800, peripheral component interfaces designed to enable peripheral component interaction with the computing device 800, and/or sensors designed to determine environmental conditions and/or location information related to the computing device 800. In various embodiments, the user interfaces could include, but are not limited to, a display, e.g., a liquid crystal display, a touch screen display, etc., a speaker, a microphone, one or more digital cameras to capture pictures and/or video, a flashlight (e.g., a light emitting diode flash), and a keyboard. In various embodiments, the peripheral component interfaces may include, but are not limited to, a non-volatile memory port, an audio jack, and a power supply interface. In various embodiments, the sensors may include, but are not limited to, a gyro sensor, an accelerometer, a proximity sensor, an ambient light sensor, and a positioning unit. The positioning unit may additionally/alternatively be part of, or interact with, the communication interface(s) 816 to communicate with components of a positioning network, e.g., a global positioning system (GPS) satellite.

In various embodiments, the computing device 800 may be a mobile computing device such as, but not limited to, a laptop computing device, a tablet computing device, a netbook, a smartphone, etc.; a desktop computing device; a workstation; a server; etc. The computing device 800 may have more or less components, and/or different architectures. In further implementations, the computing device 800 may be any other electronic device that processes data.

According to various embodiments, the present disclosure describes a number of examples.

Example 1 is an apparatus, comprising: a memory array having at least first and second blocks; and circuitry coupled with the memory array to access the memory array, wherein the circuitry includes circuit to: deselect the first block and select the second block; and supply a first bias voltage to the deselected first block and a second bias voltage to the selected second block, to reduce leakage current in the memory array, wherein the first bias voltage is different than the second bias voltage.

Example 2 may include the subject matter of Example 1, wherein the circuitry further includes circuit to: select at least one sub-block and deselect remaining sub-blocks in the selected second block, wherein the circuit to supply a first bias voltage to the deselected first block is to supply a first voltage value to a plurality of select gate drain (SGD) lines of the deselected first block, and wherein the circuit to supply a second bias voltage to the selected second block is to supply a second voltage value to an SGD line of the selected sub-block of the selected second block.

Example 3 may include the subject matter of Example 2, wherein the first voltage value is different than the second voltage value.

Example 4 may include the subject matter of Example 2, wherein the circuit to supply a first bias voltage to the deselected first block further is to supply a third voltage value to a select gate source (SGS) line of the deselected first block, and wherein the circuit to supply a second bias voltage to the selected second block further is to supply a fourth voltage value to an SGS line of the selected second block.

Example 5 may include the subject matter of Example 4, wherein the third voltage value is different than the fourth voltage value.

Example 6 may include the subject matter of Example 4, wherein the circuitry is to further: supply a fifth voltage value to deselected remaining sub-blocks in the selected second block.

Example 7 may include the subject matter of Example 6, wherein the fifth voltage value comprises about a 0 V.

Example 8 may include the subject matter of Example 7, wherein the memory array includes a common source line, wherein the circuitry is to supply a sixth voltage value to the common source line, to reduce leakage current of boosted channels of program-inhibited pillars of the memory.

Example 9 may include the subject matter of Example 1, wherein the circuitry includes at least two selection lines electrically coupled via pass transistors with respective SGS and SGD lines associated with blocks of the memory array, to supply the first and second voltages.

Example 10 may include the subject matter of Example 1, wherein the circuitry is to access the memory array in a selected one of: program mode or read mode.

Example 11 may include the subject matter of any of Examples 1 to 10, wherein the leakage current comprises a gate induced drain leakage (GIDL).

Example 12 may include the subject matter of Example 11, wherein the first voltage corresponds to a minimum value of the GIDL associated with the memory array.

Example 13 may include the subject matter of Example 11, wherein the apparatus comprises an integrated circuit, wherein the memory array comprises a three-dimensional (3D) memory array.

Example 14 is a memory array, comprising: at least first and second memory blocks; and circuitry coupled with the at least first and second memory blocks to access the at least first and second memory blocks, wherein the circuitry includes circuit to: deselect the first block and select the second block; and supply a first bias voltage to the deselected first block and a second bias voltage to the selected second block, to reduce leakage current in the memory array, wherein the first bias voltage is different than the second bias voltage.

Example 15 may include the subject matter of Example 14, wherein the circuitry further includes circuit to: select at least one sub-block and deselect remaining sub-blocks in the selected second block, wherein the circuit to supply a first bias voltage to the deselected first block is to supply a first voltage value to select gate drain (SGD) lines of the deselected first block, and wherein the circuit to supply a second bias voltage to the selected second block is to supply a second voltage value to an SGD line of the selected sub-block of the selected second block.

Example 16 may include the subject matter of Example 15, wherein the circuit to supply a first bias voltage to the deselected first block further is to supply a third voltage value to a select gate source (SGS) line of the deselected first block, and wherein the circuit to supply a second bias voltage to the selected second block further is to supply a fourth voltage value to an SGS line of the selected second block.

Example 17 is a method, comprising: deselecting, by a control circuit, at least a first block of a memory array; selecting, by the control circuit, at least a second block of the memory array; causing, by the control circuit, a first bias voltage to be supplied to the deselected first block; and causing, by the control circuit, a second bias voltage to be supplied to the selected second block, to reduce leakage current in the memory array, wherein the first voltage is different than the second voltage.

Example 18 may include the subject matter of Example 17, further comprising: selecting, by the control circuit, at least one sub-block and deselecting remaining sub-blocks in the selected second block; wherein causing a first bias voltage to be supplied to the deselected first block includes causing a first voltage value to be supplied to a plurality of select gate drain (SGD) lines of the deselected first block, and wherein causing a second bias voltage to be supplied to the selected second block includes causing a second voltage value to be supplied to an SGD line of the selected sub-block of the selected second block.

Example 19 may include the subject matter of Example 18, wherein causing a first bias voltage to be supplied to the deselected first block further includes supplying a third voltage value to a select gate source (SGS) line of the deselected first block, and wherein causing a second bias voltage to be supplied to the selected second block further includes causing a fourth voltage value to be supplied to an SGS line of the selected second block.

Example 20 may include the subject matter of Example 19, wherein the first voltage value is different than second voltage value, and wherein the third voltage value is different than the fourth voltage value.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated implementations, including what is described in the Abstract, is not intended to be exhaustive or to limit the embodiments of the present disclosure to the precise forms disclosed. While specific implementations and examples are described herein for illustrative purposes, various equivalent modifications are possible within the scope of the present disclosure, as those skilled in the relevant art will recognize.

These modifications may be made to embodiments of the present disclosure in light of the above detailed description. The terms used in the following claims should not be construed to limit various embodiments of the present disclosure to the specific implementations disclosed in the specification and the claims. Rather, the scope is to be determined entirely by the following claims, which are to be construed in accordance with established doctrines of claim interpretation.

What is claimed is:

1. An apparatus, comprising:
a memory array having at least first and second blocks; and
circuitry coupled with the memory array to access the memory array, wherein the circuitry includes a circuit to:
deselect the first block and select the second block; and
supply a first bias voltage to the deselected first block and a second bias voltage to the selected second block, wherein the first bias voltage is different than the second bias voltage and wherein the first bias voltage and the second bias voltage are supplied by applying an operation sequence of voltage values corresponding to a low end threshold value of a gate induced drain leakage (GIDL) of the memory array.

2. The apparatus of claim 1, wherein the circuitry further to:
select at least one sub-block and deselect remaining sub-blocks in the selected second block,
wherein the circuit to supply the first bias voltage to the deselected first block is to supply a first voltage value to a plurality of select gate drain (SGD) lines of the deselected first block, and
wherein the circuit to supply the second bias voltage to the selected second block is to supply a second voltage value to an SGD line of the selected sub-block of the selected second block.

3. The apparatus of claim 2, wherein the first voltage value is different than the second voltage value.

4. The apparatus of claim 2, wherein the circuit to supply the first bias voltage to the deselected first block further is to supply a third voltage value to a select gate source (SGS) line of the deselected first block, and
wherein the circuit to supply the second bias voltage to the selected second block further is to supply a fourth voltage value to an SGS line of the selected second block.

5. The apparatus of claim 4, wherein the third voltage value is different than the fourth voltage value.

6. The apparatus of claim 4, wherein the circuitry is to further:
supply a fifth voltage value to deselected remaining sub-blocks in the selected second block.

7. The apparatus of claim 6, wherein the fifth voltage value comprises about a 0 V.

8. The apparatus of claim 7, wherein the memory array includes a common source line, wherein the circuitry is to supply a sixth voltage value to the common source line, to reduce leakage current of boosted channels of program-inhibited pillars of the memory.

9. The apparatus of claim 1, wherein the circuitry includes at least two selection lines electrically coupled via pass transistors with respective SGS and SGD lines associated with blocks of the memory array, to supply the first and second voltages.

10. The apparatus of claim 1, wherein the circuitry is to access the memory array in a selected one of: program mode or read mode.

11. The apparatus of claim 1 wherein the apparatus comprises an integrated circuit, wherein the memory array comprises a three-dimensional (3D) memory array.

12. A system, comprising:
a control circuit to select a first bias voltage and a second bias voltage;
a memory array coupled to the control circuit including:
at least first and second memory blocks; and
circuitry coupled with the at least first and second memory blocks to access the at least first and second memory blocks, wherein the circuitry includes circuitry to:
deselect the first block and select the second block; and
supply the first bias voltage to the deselected first block and the second bias voltage to the selected second block, wherein the first bias voltage and the second bias voltage are supplied by applying an operation sequence of voltage values corresponding to a low end threshold value of a gate induced drain leakage (GIDL) of the memory array.

13. The system of claim 12, wherein the circuitry further includes a circuit to:
select at least one sub-block and deselect remaining sub-blocks in the selected second block,
wherein the circuit to supply the first bias voltage to the deselected first block is to supply a first voltage value to select gate drain (SGD) lines of the deselected first block, and
wherein the circuit to supply the second bias voltage to the selected second block is to supply a second voltage value to an SGD line of the selected sub-block of the selected second block.

14. The system of claim 13, wherein the circuit to supply the first bias voltage to the deselected first block further is to supply a third voltage value to a select gate source (SGS) line of the deselected first block, and
wherein the circuit to supply the second bias voltage to the selected second block further is to supply a fourth voltage value to an SGS line of the selected second block.

15. A method, comprising:
deselecting, by a control circuit, at least a first block of a memory array;
selecting, by the control circuit, at least a second block of the memory array;

causing, by the control circuit, a first bias voltage to be supplied to the deselected first block; and causing, by the control circuit, a second bias voltage to be supplied to the selected second block, wherein the first voltage is different than the second voltage and wherein the first bias voltage and the second bias voltage are supplied by applying an operation sequence of voltage values corresponding to a low end threshold value of a gate induced drain leakage (GIDL) of the memory array.

16. The method of claim 15, further comprising:

selecting, by the control circuit, at least one sub-block and deselecting remaining sub-blocks in the selected second block;

wherein causing the first bias voltage to be supplied to the deselected first block includes causing a first voltage value to be supplied to a plurality of select gate drain (SGD) lines of the deselected first block, and wherein causing the second bias voltage to be supplied to the selected second block includes causing a second voltage value to be supplied to an SGD line of the selected sub-block of the selected second block.

17. The method of claim 16, wherein causing the first bias voltage to be supplied to the deselected first block further includes supplying a third voltage value to a select gate source (SGS) line of the deselected first block, and wherein causing the second bias voltage to be supplied to the selected second block further includes causing a fourth voltage value to be supplied to an SGS line of the selected second block.

18. The method of claim 17, wherein the first voltage value is different than the second voltage value, and wherein the third voltage value is different than the fourth voltage value.

* * * * *